(12) United States Patent
Kanda

(10) Patent No.: US 7,102,228 B2
(45) Date of Patent: Sep. 5, 2006

(54) SEMICONDUCTOR DEVICE

(75) Inventor: Takashi Kanda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/089,212

(22) Filed: Mar. 25, 2005

(65) Prior Publication Data
US 2005/0161816 A1   Jul. 28, 2005

Related U.S. Application Data

(63) Continuation of application No. PCT/JP03/03733, filed on Mar. 26, 2003.

(51) Int. Cl.
H01L 23/06 (2006.01)
H01L 23/04 (2006.01)
H01L 23/12 (2006.01)

(52) U.S. Cl. ............ 257/730; 257/729; 257/731; 257/732; 257/733

(58) Field of Classification Search ........ 257/678, 257/689, 698–713, 720, 729–733, 737, 773, 257/775; 254/684
See application file for complete search history.

(56) References Cited

U.S. PATENT DOCUMENTS 5,841,194 A    11/1998  Tsukamoto
5,895,965 A     4/1999  Tanaka et al.
5,983,974 A *  11/1999  Sylvester ................. 164/97
6,011,304 A *   1/2000  Mertol .................... 257/706
6,078,506 A     6/2000  Sugahara
6,232,652 B1*   5/2001  Matsushima ............. 257/667
6,441,499 B1*   8/2002  Nagarajan et al. ....... 257/780
6,590,278 B1*   7/2003  Behun et al. ............ 257/675
6,703,704 B1*   3/2004  Alcoe et al. ............. 257/688

FOREIGN PATENT DOCUMENTS

| EP | 0 797 253 | 9/1997 |
| JP | 9-260527 | 10/1997 |
| JP | 10-056110 | 2/1998 |
| JP | 11-40687 | 2/1999 |
| JP | 2000-276567 | 10/2000 |

* cited by examiner

Primary Examiner—Jasmine Clark
(74) Attorney, Agent, or Firm—Staas & Halsey LLP

(57) ABSTRACT

A semiconductor device comprising a substrate, a semiconductor element mounted on the substrate, an inner annular stiffener provided on the substrate in an outer side of the semiconductor element, and an outer annular stiffener provided on the substrate in an outer side of the inner annular stiffener. The inner annular stiffener and the outer annular stiffener are made of different materials. Particularly, the thermal expansion coefficient of the inner annular stiffener is selected to be smaller than that of the substrate, and the thermal expansion coefficient of the outer annular stiffener is selected to be larger than that of the substrate. The amount of deformation of the substrate is thus decreased.

6 Claims, 3 Drawing Sheets

SEMICONDUCTOR DEVICE

CROSS-REFERENCE TO RELATED APPLICATION

This application is a continuation of PCT/JP03/03733, filed on Mar. 26, 2003, the contents being incorporated herein by reference.

TECHNICAL FIELD

The present invention relates to a semiconductor device comprising a semiconductor element mounted on a substrate.

BACKGROUND ART

Semiconductor devices comprising a semiconductor element mounted on a substrate are well-known. The wire-chip bonding and the flip-chip bonding are effected in mounting the semiconductor element on the substrate. Flip-chip bonding is widely used, because it is a trend to decrease the pitch between the electrodes. To effect the flip-chip bonding, solder balls are provided on the electrodes of a semiconductor element and are joined to the electrodes of the substrate while heating the semiconductor element and the substrate. As a result, the semiconductor element is electrically and mechanically bonded to the substrate.

Recently, there is a tendency to decrease the thickness of the substrate. As the thickness decreases, the substrate tends to be deformed upon receiving thermal load and, hence, to be warped or undulated. Therefore, it has been attempted to provide an annular stiffener on the surface of the substrate surrounding the semiconductor element to prevent the deformation of the substrate relying upon the stiffness of the stiffener. A semiconductor device provided with an annular stiffener is disclosed in, for example, JP-A-9-260527.

According to this prior art, the annular stiffener is made of a material having a thermal expansion coefficient greater than the thermal expansion coefficient of the substrate. When the substrate is subjected to a high-temperature state, the annular stiffener expands more than the substrate; i.e., the annular stiffener pulls the substrate outward so as to maintain it flat.

However, the substrate is generally returned back to the normal-temperature state from the high-temperature state. Then, the annular stiffener contracts more greatly than the substrate, whereby the substrate contracts. Therefore, the substrate does not assume a completely flat state and adversely affects the subsequent processing steps such as joining using the BGA balls.

DISCLOSURE OF THE INVENTION

It is therefore an object of the present invention to provide a semiconductor device having a double-stiffener structure enabling the substrate to be maintained in a flat state.

A semiconductor device according to the present invention comprises a substrate, a semiconductor element mounted on the substrate, an inner annular stiffener provided on the substrate in an outer side of the semiconductor element, and an outer annular stiffener provided on the substrate in an outer side of the inner annular stiffener, wherein the inner annular stiffener and the outer annular stiffener are made of materials having different thermal expansion coefficients.

According to this constitution, the inner and outer annular stiffeners can impart stiffness to the substrate to thereby maintain the substrate in a flat state. The inner and outer annular stiffeners are made of materials having different thermal expansion coefficients, and are selected in such a combination that a synthesized thermal expansion coefficient averaging the thermal expansion coefficients of these materials becomes close to the thermal expansion coefficient of the substrate. Therefore, the inner and outer annular stiffeners can exhibit the thermal expansion and thermal contraction so as to hold the substrate in a flat attitude while being heated and cooled.

Preferably, the inner annular stiffener and the outer annular stiffener are made of a metal material. The inner annular stiffener and the outer annular stiffener have a thickness greater than that of the substrate. The thermal expansion coefficient of the inner annular stiffener is smaller than that of the outer annular stiffener.

Preferably, the inner annular stiffener and the outer annular stiffener are provided on the substrate on the same side as the semiconductor element. The semiconductor element is joined to the substrate by using solder balls, and the inner annular stiffener and the outer annular stiffener are joined to the substrate with an adhesive. Solder balls for connection to the wiring board are provided on the substrate on a surface thereof opposite to the surface having the semiconductor element.

BEST MODE FOR CARRYING OUT THE INVENTION

Figure 1:
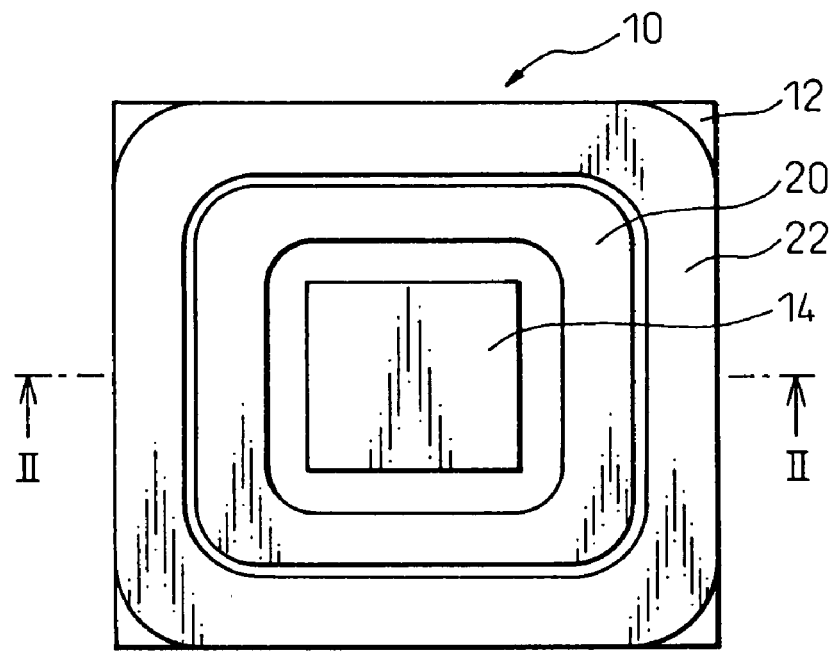
FIG. 1 is a plan view illustrating a semiconductor device according to an embodiment of the present invention.
Figure 2:
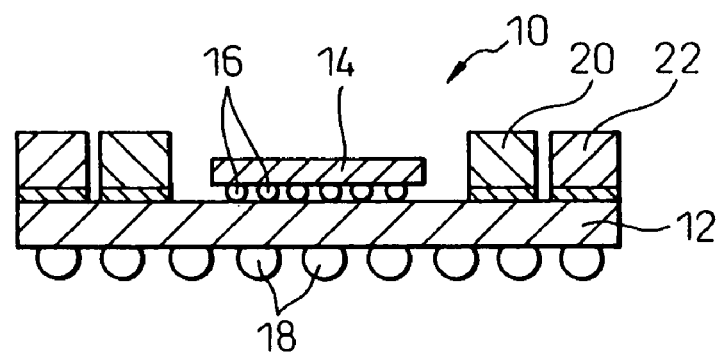
FIG. 2 is a sectional view of the semiconductor device of FIG. 1 taken along the line II—II in FIG. 1.

FIGS. 1 and 2 are views illustrating a semiconductor device according to an embodiment of the present invention. A semiconductor device 10 comprises a substrate 12 and a semiconductor element 14 mounted on the substrate 12. The semiconductor element 14 is a semiconductor chip constituting a CPU and has solder balls 16 provided on the electrodes thereof. The substrate has electrodes corresponding to the solder balls 16 of the semiconductor element 14, and also has a circuit pattern inclusive of the electrodes. The substrate 12 is made of an organic resin material such as a BT resin. The substrate 12 is prepared as a one-layer substrate or a multi-layer substrate, and comprises a resin material used as a base and a conducting material such as Cu or the like forming electrodes and a circuit pattern.

The semiconductor element 14 and the substrate 12 are electrically and mechanically bonded together by joining the solder balls 16 to the electrodes of the substrate 12 while heating the semiconductor element 14 and the substrate 12.

On the back surface of the substrate 12, there are further provided solder balls 18 for connection of the semiconductor device to a wiring board. The electrodes on the front surface of the substrate 12 and the solder balls 18 on the back surface thereof are connected together through via-holes or a circuit pattern.

The semiconductor device 10 further comprises an inner annular stiffener 20 provided on the substrate 12 in an outer side of the semiconductor element 14 and an outer annular stiffener 22 provided on the substrate 12 in an outer side of the inner annular stiffener 20. The inner annular stiffener 20 and the outer annular stiffener 22 are provided on the substrate 12 on the same side of the semiconductor element 14. The semiconductor element 14 is joined to the substrate 12 through the solder balls 16. The solder balls 18 for connection of the semiconductor device to the wiring board are provided on the substrate 12 on a surface thereof opposite to the surface having the semiconductor element 14. In this embodiment, the substrate 12 and the semiconductor element 14 have a substantially square shape, and the inner annular stiffener 20 and the outer annular stiffener 22 also have a substantially square shape. The inner annular stiffener 20 and the outer annular stiffener 22 are made of materials having different thermal expansion coefficients. The inner annular stiffener 20 and the outer annular stiffener 22 are joined to the substrate 12 with an adhesive.

The inner and outer annular stiffeners 20 and 22 can impart stiffness to the substrate 12 to thereby maintain the substrate 12 in a flat state. The inner and outer annular stiffeners 20 and 22 are made of materials having different thermal expansion coefficients, and are selected in such a combination that a synthesized thermal expansion coefficient averaging the thermal expansion coefficients of these materials becomes close to the thermal expansion coefficient of the substrate 12. Therefore, the inner and outer annular stiffeners 20 and 22 undergo the thermal expansion and thermal contraction as in the substrate 12 so as to hold the substrate 12 in a flat attitude while being heated and cooled.

In the semiconductor device 10 used as the CPU, the thickness of the substrate 12 is ever decreasing to lower the impedance for the power source and the grounding, and to decrease the noise. Therefore, the inner and outer annular stiffeners 20 and 22 are provided to reinforce the thin substrate 12. Impedance is not affected on the region of the substrate 12 on the outer side of the semiconductor element 14. Therefore, the inner and outer annular stiffeners 20 and 22 having a large thickness can be provided thereon.

Figure 3A:
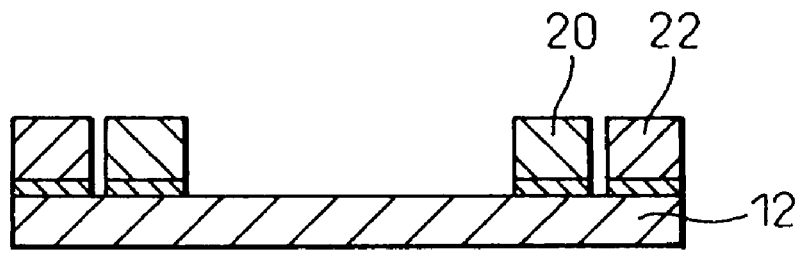
FIGS. 3A to 3C are views illustrating a process for mounting the semiconductor device of FIG. 1.
Figure 3B:
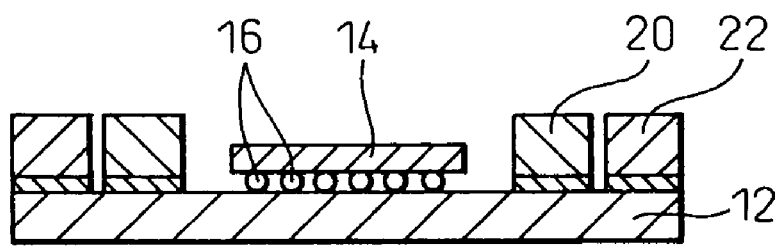
Figure 3C:
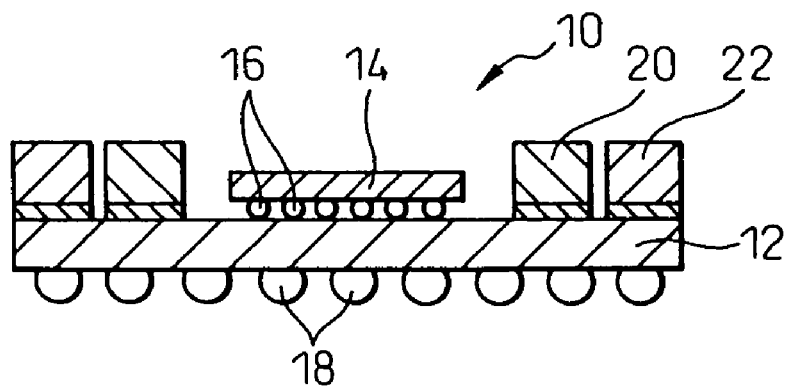

FIGS. 3A to 3C are views illustrating a process for mounting the semiconductor device 10 of FIG. 1. First, as illustrated in FIG. 3A, the inner annular stiffener 20 and the outer annular stiffener 22 are simultaneously mounted (at one time) on the substrate 12 by using an adhesive. As illustrated in FIG. 3B, the semiconductor element 14 is bonded to the substrate 12 with the solder balls 16. As illustrated in FIG. 3C, the solder balls 18 for connection to the wiring board are attached to the substrate 12 on the side opposite to the semiconductor element 14. Thereafter, the semiconductor device 10 is mounted on the wiring board via the solder balls 18.

More especially, the inner annular stiffener 20 and the outer annular stiffener 22 are made of a metal material. The inner annular stiffener 20 and the outer annular stiffener 22 have a thickness larger than that of the substrate 12. For example, the inner annular stiffener 20 and the outer annular stiffener 22 have a thickness of about 1 mm, while the substrate 12 has a thickness of about 0.5 mm. Therefore, the inner annular stiffener 20 and the outer annular stiffener 22 possess a considerably large strength to thereby prevent the substrate 12 from deforming.

Either the thermal expansion coefficient of the inner annular stiffener 20 or the thermal expansion coefficient of the outer annular stiffener 22 can be selected to be greater than the other one. However, preferably, the thermal expansion coefficient of the inner annular stiffener 20 is smaller than that of the outer annular stiffener 22.

For example, the substrate 12 made of a BT resin has a thermal expansion coefficient of 20 ppm (the thermal expansion coefficient of the substrate 12 in this case is a thermal expansion coefficient of a combination of the resin and the conductor). Contrary to this, the metal materials suited for the stiffeners include SUS (thermal expansion coefficient of 17.3 ppm), Cu (thermal expansion coefficient of 17.3 ppm) and Al (thermal expansion coefficient of 24.3 ppm).

In the embodiment of the invention, the inner annular stiffener 20 is made of SUS (thermal expansion coefficient of 17.3 ppm) and the outer annular stiffener 22 is made of Al (thermal expansion coefficient of 24.3 ppm). In this case, the synthesized thermal expansion coefficient which is an average thermal expansion coefficient of these materials is 20.8 ppm.

Figure 4:
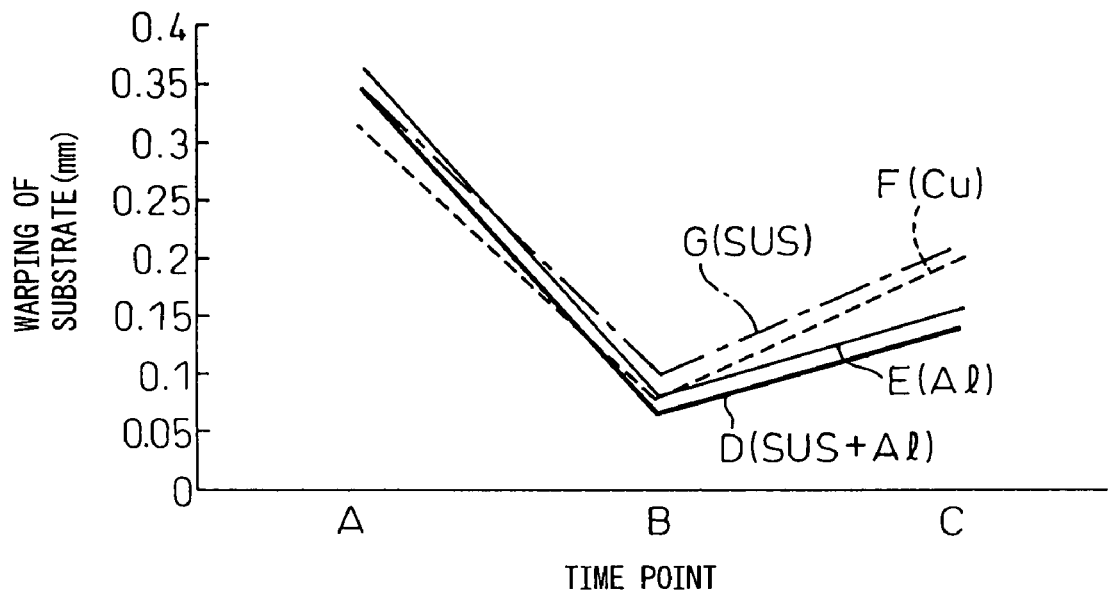
FIG. 4 is a diagram illustrating the warping amount of the substrate of the semiconductor device according to the present invention and the warping amounts of the semiconductor devices according to Comparative Examples.

FIG. 4 is a diagram illustrating the warping amount of the substrate of the semiconductor device according to the present invention and the warping amounts of the semiconductor devices according to Comparative Examples, wherein a time point A on the abscissa represents a state of the substrate without the stiffener, a time point B represents a state of the substrate mounting the stiffeners, and a time point C represents a state where the stiffeners and the semiconductor element 14 are mounted.

A thick solid line curve D represents the warping amount of the substrate 12 of the invention having the inner annular stiffener (SUS) 20 and the outer annular stiffener (Al) 22. The warping amount at the time point A is 0.356 mm, the warping amount at the time point B is 0.064 mm, and the warping amount at the time point C is 0.144 mm.

A fine solid line curve E represents the warping amount of the substrate of Comparative Example having a single stiffener made of Al. The warping amount at the time point A is 0.376 mm, the warping amount at the time point B is 0.081 mm, and the warping amount at the time point C is 0.160 mm.

A dotted line curve F represents the warping amount of the substrate of Comparative Example having a single stiffener made of Cu. The warping amount at the time point A is 0.320 mm, the warping amount at the time point B is 0.076 mm, and the warping amount at the time point C is 0.206 mm.

A dot-dash chain line curve G represents the warping amount of the substrate of Comparative Example having a single stiffener made of SUS. The warping amount at the time point A is 0.358 mm, the warping amount at the time point B is 0.100 mm, and the warping amount at the time point C is 0.217 mm.

In each of these examples, the warping amounts are decreasing at the time point B proving that provision of the stiffeners helps decrease the warping amount of the substrate 12. In each of the examples, the warping amounts at the time point C are becoming greater than the warping amounts at the time point B. That is, at the time of mounting the semiconductor element 14 on the substrate 12 through the solder balls 16, the semiconductor element 14 and the substrate 12 are heated and then cooled. Therefore, the substrate is deformed upon receiving different thermal stresses and is warped in large amounts. In the semiconductor device 10 of the present invention represented by a thick solid line, the warping amount is the smallest despite of receiving the same thermal stress.

In the reflow step of joining the solder balls 16 onto the electrodes of the substrate 12, the substrate 12 warps due to a difference in the thermal expansion during the heating, and then, when returned back to normal temperature, the substrate 12 warps due to a difference in the thermal contraction. Use of the single annular stiffener is not enough to cope with the situation at the times of high temperatures and normal temperature. In the case of the Comparative Example represented by the fine solid line, when the substrate is placed in the high-temperature state, since the annular stiffener expands to pull the substrate outward, the substrate is maintained flat to some extent. However, when returned from the high-temperature state back to the normal-temperature state, the annular stiffener greatly contracts and draws the substrate in a manner to contract it. Therefore, the substrate does not assume a completely flat state. In this case, the subsequent steps such as joining the BGA balls may be often adversely affected.

In the case of the present invention represented by the thick solid line, one of the two annular stiffeners 20 and 22 pulls the substrate outward when the substrate is placed in a high-temperature state, and when the substrate is returned from the high-temperature state back to the normal-temperature state, another one of the two annular stiffeners 20 and 22 contracts without permitting the substrate 12 to contract more than its own contraction; i.e., the substrate 12 is maintained nearly in a flat state. In this case, it is desired that the thermal expansion coefficient of the inner annular stiffener 20 is smaller than the thermal expansion coefficient of the outer annular stiffener 22.

Basically, it is considered that even the single annular stiffener works not to deform the substrate 12 that is caused by a difference in the thermal expansion and contraction between the substrate 12 and the stiffener provided the annular stiffener has the thermal expansion coefficient which is the same as the coefficient of expansion of the substrate 12 since there is no difference in the thermal expansion or in the thermal contraction between the substrate 12 and the annular stiffener during the heating and cooling. However, in practice, it is difficult to form the annular stiffener using a suitable material which exhibits the thermal expansion coefficient which is the same as that of the substrate 12. Therefore, there are provided the inner and outer annular stiffeners 20 and 22, so that the synthesized thermal expansion coefficient which is an average thermal expansion coefficient of these materials is brought close to the thermal expansion coefficient of the substrate 12, i.e., so that they can be regarded as a single annular stiffener having a thermal expansion coefficient which is the same as the thermal expansion coefficient of the substrate 12.

Figure 5:
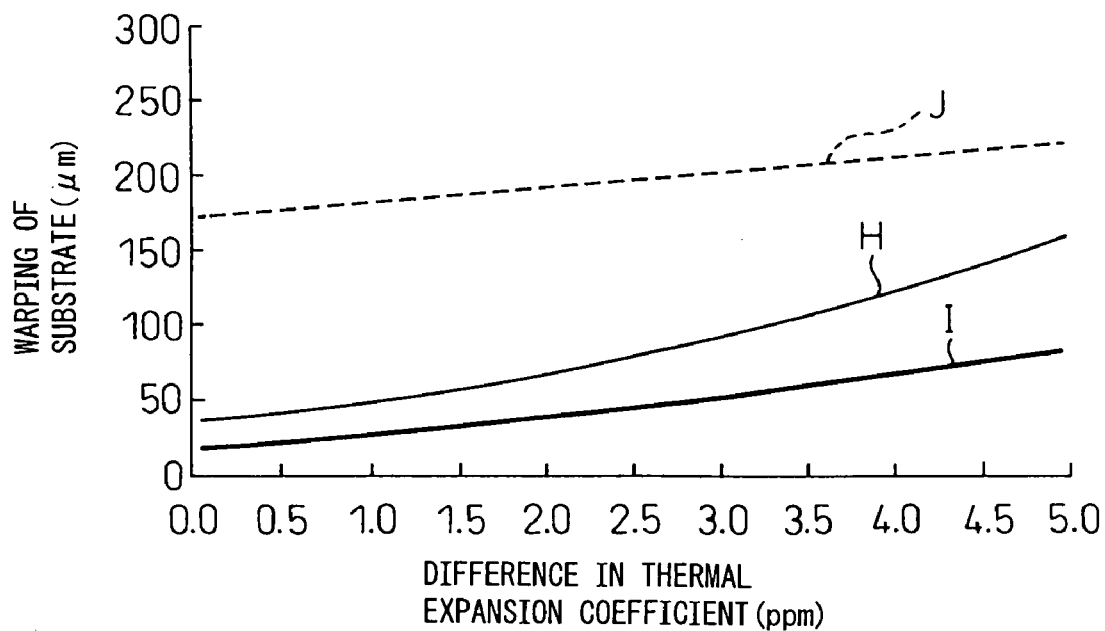
FIG. 5 is a diagram illustrating a relationship between the warping amount of the substrate and the difference between the thermal expansion coefficient of the substrate and the synthesized coefficient of thermal expansion of the inner and outer annular stiffeners.

FIG. 5 is a diagram illustrating a relationship between the warping amount of the substrate and the difference between the thermal expansion coefficient of the substrate and the synthesized thermal expansion coefficient of the inner and outer annular stiffeners. A curve H represents the warping amount of the substrate 12 obtained when the inner and outer annular stiffeners 20 and 22 are mounted on the substrate 12. A curve I represents the warping amount of the substrate 12 at a reflow time point (moment of a high temperature) of when the semiconductor element 14 is mounted on the substrate 12. A curve J represents the warping amount of the substrate 12 at a time point (moment of normal temperature) after the semiconductor element 14 is mounted on the substrate 12. The curve J indicates that the warping amount becomes small when the difference is small between the thermal expansion coefficient of the substrate 12 and the synthesized thermal expansion coefficient of the inner and outer annular stiffeners 20 and 22.

According to the present invention as described above, the substrate can be maintained flat both when the temperature is high and when the temperature is normal, thereby realizing an improved yield of joining the semiconductor to elements and improved reliability owing to decreased stress in the junction portions.

The invention claimed is:

1. A semiconductor device comprising a substrate, a semiconductor element mounted on said substrate, an inner annular stiffener provided on said substrate in an outer side of said semiconductor element, and an outer annular stiffener provided on said substrate in an outer side of said inner annular stiffener, wherein said inner annular stiffener and said outer annular stiffener are made of different materials.

2. A semiconductor device according to claim 1, wherein said inner annular stiffener and said outer annular stiffener are made of a metal material.

3. A semiconductor device according to claim 1, wherein said substrate is made of an organic resin material.

4. A semiconductor device according to claim 1, wherein said inner annular stiffener and said outer annular stiffener are provided on the substrate on the same side as the semiconductor element.

5. A semiconductor device according to claim 1, wherein solder balls for connection to the wiring board are provided on the substrate on a side thereof opposite to the side mounting semiconductor element.

6. A semiconductor device according to claim 1, wherein the thermal expansion coefficient of the inner annular stiffener is smaller than that of the outer annular stiffener.

* * * * *